United States Patent [19]

Goto et al.

[11] Patent Number: 4,472,758
[45] Date of Patent: Sep. 18, 1984

[54] CAPACITIVE SWITCHING DEVICE

[75] Inventors: Hideo Goto; Takeo Hosoe; Mitumasa Kako, all of Nagoya, Japan

[73] Assignee: Brother Kogyo Kabushiki Kaisha, Aichi, Japan

[21] Appl. No.: 487,838

[22] Filed: Apr. 22, 1983

[30] Foreign Application Priority Data

Apr. 30, 1982 [JP] Japan .................................. 57-74123

[51] Int. Cl.³ .............................................. H01G 5/01
[52] U.S. Cl. ............................... 361/288; 200/DIG. 1
[58] Field of Search ............................. 361/287, 288; 84/DIG. 7; 200/DIG. 1; 29/25.42

[56] References Cited

U.S. PATENT DOCUMENTS 3,659,163 4/1972 Borisov et al. ...................... 361/288
3,951,250 4/1976 Pointon et al. ............. 200/DIG. 1 X
3,965,399 6/1976 Walker et al. ........................ 361/288
4,047,241 9/1977 Lau et al. .................. 200/DIG. 1 X Primary Examiner—Donald A. Griffin
Attorney, Agent, or Firm—Browdy and Neimark

[57] ABSTRACT

A capacitive switching device having a pair of stationary electrodes, a movable electrode disposed capacitively relative to the stationary electrodes, and an actuator carrying the movable electrode and including a resilient member biasing the actuator away from the stationary electrodes. The movable electrode comprises a sponge member having non-porous layers on opposite sides thereof, and a resilient conductive layer adhering to one of the non-porous layers. The other non-porous layer is secured to the actuator such that the resilient conductive layer faces the stationary electrodes. A process of manufacturing the device is also disclosed. The process comprises producing the sponge member, securing a release paper with an adhesive to non-porous layers of the sponge member, removing the release paper from the non-porous layers with the adhesive left thereon, securing a resilient conductive layer to one of the non-porous layers with the adhesive left, and securing the sponge member to the actuator with the adhesive left on the other non-porous layer so that the conductive layer faces the stationary electrodes.

11 Claims, 9 Drawing Figures

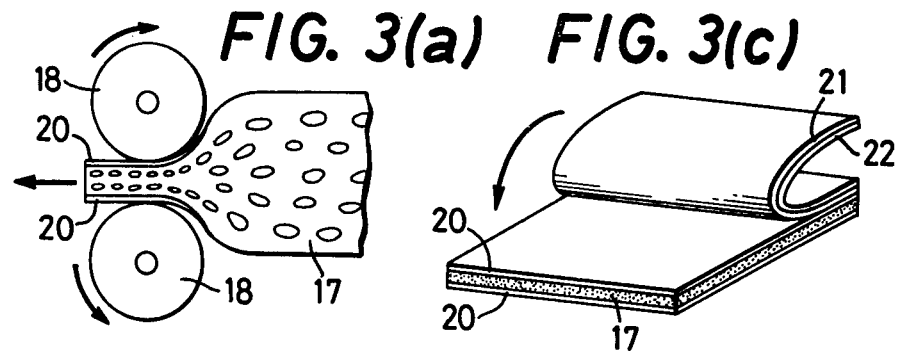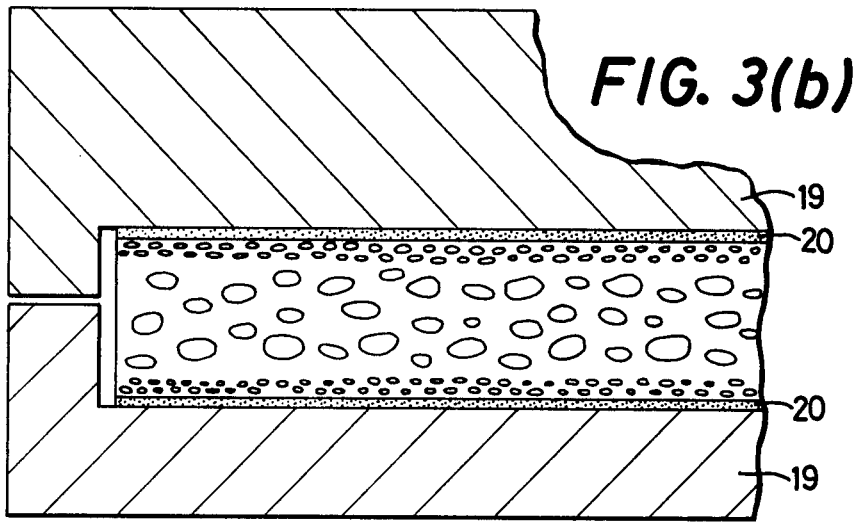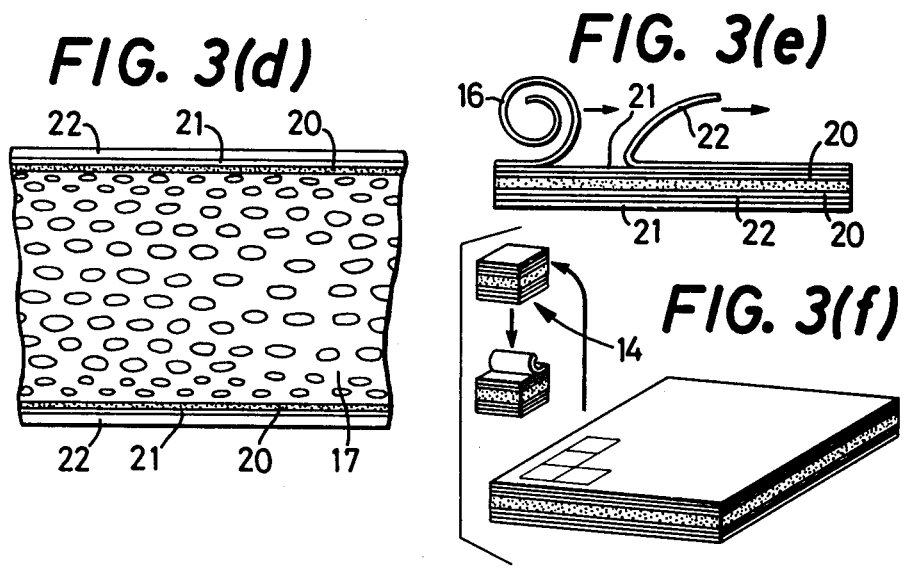

CAPACITIVE SWITCHING DEVICE

BACKGROUND OF THE INVENTION

This invention relates to a keyboard switching assembly in the form of a variable capacitor or condenser capable of producing an electrical output through variation in capacitance thereof, and a process of manufacturing the switching assembly, more particularly, a movable electrode thereof.

Various forms of keyboard switching devices of different constructions and characteristics have been proposed for producing electrical outputs which correspond to data input keys on a keyboard which have been depressed or operated. For example, there have been marketed and used magnetically operated reed switches (combination of ferromagnetic reeds and a permanent magnet), switches having gold-plated contacts, and other contact-equipped switches wherein contacts are mechanically operated to make and break a circuit. Contactless keyboard switches have also been developed making use of magnet- or pressure-sensitive elements. While the contactless switches in the form of a variable capacitor are considerably advantageous in cost of materials over the contact-equipped switches and the contactless switches using the magnet- or pressure-sensitive elements, they have not been found completely satisfactory in performance in terms of operating accuracy, durability, and reliability.

There has been thus developed a need for a keyboard switching device or assembly of variable capacitance type which is improved in performance or capability. For example, a capacitive switch is known according to Japanese Patent Application No. 48-21592 (filed on Feb. 22, 1973, laid open as Publication No. 49-109872 on Oct. 18, 1974), wherein a movable electrode is formed of a spongy material, polyester films bonded under heat to opposite surfaces of the spongy material with heat-sensitive adhesive layers coated on said opposite surfaces, an evaporated aluminum film adhering to one of the polyester films with a coating of mucilage or glue, and a sheet of release paper attached to the other polyester layer with another coating of the same mucilage or glue, which release paper does not permit the mucilage or glue to permeate thereinto, and is removed when the movable electrode is secured to a movable support member of a switching device. The polyester films bonded with the adhesive layers having no permeability after they have been cured, will function to prevent the used mucilage or glue from penetrating therethrough into the interior of the spongy material. Thus, the spongy material is not hardened by otherwise possible penetration of the mucilage or glue, and therefore the movable electrode is operable in good physical conditions for a longer period of service, contributing to improvement in performance of the capacitive switch.

However, it has been found time-consuming and cumbersome to bond such polyester films under heat to upper and lower surfaces of the spongy material, and technically difficult to obtain an overall thickness of the movable electrode with sufficiently high accuracy within a predetermined tolerance. Thus, the known keyboard switching devices in the form of a variable capacitor still suffer drawbacks as described hereinbefore.

SUMMARY OF THE INVENTION

It is accordingly an object of the present invention to provide a capacitive switching device and a movable electrode therefor which overcome the drawbacks experienced in the art, and which assure a reliable operation thereof and are economical to manufacture.

Another object of the invention is to provide a process of manufacturing such capacitive switching device which has a movable electrode formed of a spongy material of thickness within a close tolerance, and which has no polyester or like films bonded to the spongy material as in the prior art movable electrodes.

According to the present invention, there is provided a capacitive switching device having a substrate baseplate, a pair of conductive-pattern stationary electrodes of planar configuration disposed on the substrate baseplate, an insulating film covering the stationary electrodes, a movable electrode disposed movably relative to the stationary electrodes so as to form a variable capacitor, and actuating means for displacing the movable electrode toward and away from the stationary electrodes. The actuating means includes a support member which carries the movable electrode and a manually operated portion, and further includes a resilient member biasing the support member in a direction away from the stationary electrodes. The movable electrode comprises a sponge member fabricated of a spongy porous material by compression at an elevated temperature and thereby having on opposite sides thereof substantially non-porous layers having smooth surfaces. The movable electrode further comprises a resilient conductive layer secured with an adhesive to one of the non-porous layers, the other non-porous layer being secured with an adhesive to the actuating means such that the resilient conductive layer faces the stationary electrodes through the insulating film.

In accordance with the invention, there is also provided a process of manufacturing a capacitive switching device which has a pair of conductive-pattern stationary electrodes of planar configuration disposed on a substrate baseplate and covered with an insulating film, a movable electrode disposed movably relative to the stationary electrodes so as to form a variable capacitor, and actuating means for displacing the movable electrode toward and away from the stationary electrodes and biasing the movable electrode in a direction away from the stationary electrodes. The process comprises: compressing a sheet-like spongy porous material while applying heat to opposite sides thereof, and thereby producing a sponge member of a predetermined thickness having on the opposite sides upper and lower non-porous layers, respectively, which non-porous layers have smooth surfaces; applying a coating of an adhesive agent to one surface of a sheet of release paper made of a material which does not permit the adhesive agent to permeate therethrough to the other surface thereof; securing the sheet of release paper with the adhesive agent to the upper and lower non-porous layers of the sponge member; removing the sheet of release paper from one of the upper and lower non-porous layers, and securing a resilient conductive layer to said one non-porous layer with the adhesive agent left thereon; and removing the sheet of release paper from the other non-porous layer, and securing the sponge member to the actuating means with the adhesive agent left on said other non-porous layer such that the resilient conductive layer faces the stationary electrodes.

The movable electrode of a capacitive switching device according to the present invention is advantageous in that its spongy porous material is given upper and lower non-porous layers during compression thereof under heat to predetermined thickness. The non-porous layers are effective for preventing penetration of mucilage or glue spread on the layers into the obtained sponge portion of the electrode, and consequent hardening of the sponge portion which causes inaccurate switching actions of the switching device. Thus, the process of the invention has eliminated a conventionally employed step of bonding polyester or similar layers to the spongy porous material for blocking the above penetration.

BRIEF DESCRIPTION OF THE DRAWINGS

The above and other objects, features and advantages of the present invention will become more apparent from reading the following description of the preferred embodiments taken in connection with the accompanying drawings in which:

FIGS. 3(a) through (f) illustrate steps used in a process of the invention for manufacturing a movable electrode employed in the capacitive switching device.

DETAILED DESCRIPTION OF THE PREFERRED EMBODIMENT

Figure 1:
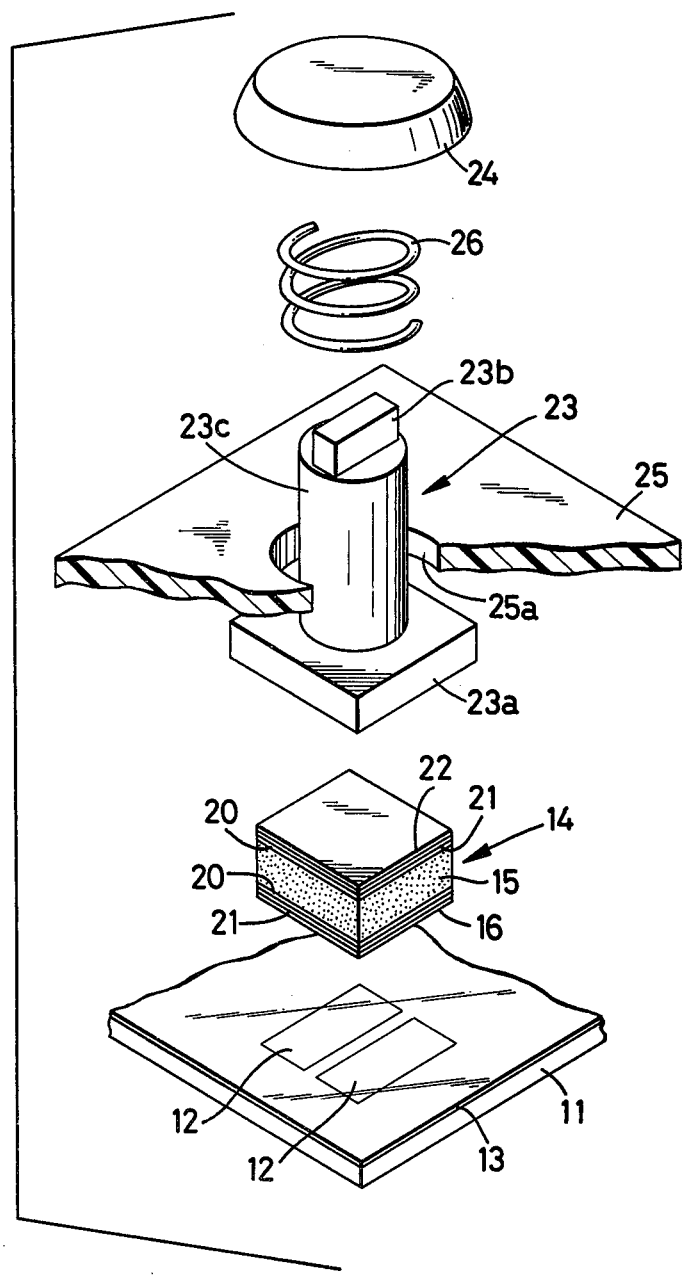
FIG. 1 is an exploded view in perspective of one embodiment of a capacitive switching device of the present invention.
Figure 2:
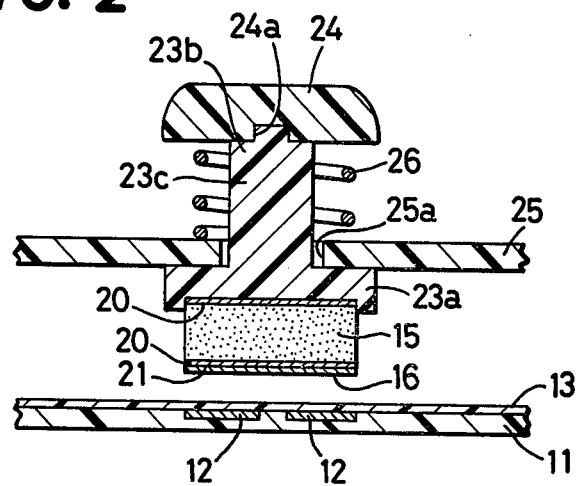
FIG. 2 is a side elevation in cross section of the switching device of FIG. 1.

Referring to FIGS. 1 and 2, there is illustrated a capacitive switching device or assembly used in association with a keyboard, wherein a pair of conductive-pattern, stationary electrodes 12 of planar configuration are etched in parallel to each other on one surface of a substrate board or baseplate 11. One of the stationary electrodes 12 serves as a transmitter, and the other as a receiver. The electrodes 12 are covered with a transparent film 13 of a suitable insulating material.

Above the stationary electrodes 12, are disposed a movable electrode 14 which is aligned with the stationary electrodes 12 in face-to-face relation and movable toward and away from the electrodes 12 so as to form a variable capacitor in cooperation with the electrodes 12. This movable electrode 14 is substantively formed of a sponge member 15 which is fabricated of a spongy porous material, and a resilient conductive layer 16 provided on the lower side of the sponge member 15. The movable electrode 14 is produced in a manner as shown in FIGS. 3(a) through (f). To begin with, a sheet-like soft sponge material 17 having successive foams or pores is prepared so that the spongy sheet has a thickness slightly greater than that of the end product. The prepared sheet material is then compressed under heat or at elevated temperatures in a direction across the thickness thereof. This compression of the material 17 is effected by passing the material between a pair of rolls 18 spaced from each other so as to estabish a desired thickness of the rolled material, as shown in FIG. 3(a), or by pressing the material 17 in dies or molds 19, 19 prepared to meet the thickness requirement of the pressed material, as shown in FIG. 3(b). This hot-working rolling or pressing operation allows the spongy material 17 to be compressed to exact thickness and provides the compressed material with substantially non-porous layers 20, 20 adjacent the upper and lower surfaces thereof. These non-porous layers 20 which have a smooth surface, are formed through fusion of upper and lower skin layers of the material 17 during heat application and subsequent setting or curing thereof because the porosity of the material 17 or density of foams present therein decreases from the skin layers toward the center or core portion of the material.

Then, a suitable adhesive agent 21 is spread over one surface of a sheet of release paper 22 which is comparatively tough and strong and does not permit the adhesive agent 21 to permeate therethrough. The release paper sheet 22 coated with the adhesive agent 21 is bonded to one of the opposite surfaces of the compressed material 17, i.e., to one of the upper and lower non-porous layers 20, from one end thereof toward the other end slowly and with care so as not to deform the soft sponge material 17, as shown in FIG. 3(c). Another sheet of release paper 22 is similarly secured to the other surface of the material 17 whereby a laminated body of multiple layers is obtained as illustrated in FIG. 3(d). The release paper sheet 22 is removed or peeled off from one of upper and lower surfaces of the laminated body while leaving a film or coating of the adhesive agent 21 on the non-porous layer. As the sheet 22 is removed, a resilient conductive film or layer 16 is bonded to the surface of the non-porous layer 20 on which the adhesive agent left remains to be spread, as shown in FIG. 3(e). The laminated body with the resilient conductive layer 16 secured thereto is then subjected to a blanking operation, as indicated in FIG. 3(f), and a plurality of movable electrodes 14 are produced.

The remaining release paper sheet 22 is subsequently removed from the other surface of the laminated body before the movable electrode 14 is secured to a flange portion 23a of a support member 23 described later in detail. To secure the electrode 14 to the flange portion 23a, said other surface (upper surface in FIG. 1) of the laminated body on which the adhesive agent 21 remains to be present, is bonded with this remaining adhesive agent to a lower surface of the flange portion 23a such that the lower resilient conductive layer 16 faces the stationary electrodes 12 on the baseplate 11 as illustrated in FIG. 2.

As indicated above, the movable electrode 14 is carried by the flange portion 23a of the support member 23. The support member 23 further includes a head portion 23b, and a keystem or cylindrical portion 23c connecting the flange and head portions 23a and 23b. The head portion 23b is a rectangular protrusion from the upper end of the cylindrical portion 23c, which protrusion engages a mating slot 24a formed in the lower surface of a key 24, whereby the support member 23 carries the key 24 which is manually depressed. The cylindrical portion 23c extends through a hole 25a in a keyboard 25 so that the key 24 is located above, and the flange portion 23a below, the keyboard 25. The support memmber 23, and the key 24 and the movable electrode 14 carried by the support member 23, are normally held at its upper position of FIG. 2 by a coil spring 26 which is wound on an upper part of the cylindrical portion 23c. The upper end of the spring 26 bears on the lower surface of the key 24 and the other end on the upper surface of the keyboard 25. As disclosed hereinbefore, the movable electrode 14 is movably supported by an actuator which comprises the support member 23, key 24, keyboard 25 and coil spring 26.

Upon depressing the key 24 by applying a finger pressure thereto, the support member 23 and the movable electrode 14 attached to the flange portion 23a are moved downwardly integrally with the key 14 against a biasing force of the coil spring 26, whereby the resilient conductive layer 16 is brought into close or snug contact with the insulating film 13 and the stationary electrodes 12. In this instance, a part of the downward movement of the key 24 or support member 23 is absorbed by contraction of the sponge member 15. As the movable electrodes 14 approaches the stationary electrodes 12, an electrostatic capacitance between the two stationary electrodes 12 is increased and consequently a high-frequency signal is fed from the transmitter to the receiver. When the key 24 is released, the movable electrode 14 and the support member 23 are moved upwardly to return to its normal position with the biasing force of the coil spring 26, and the resilient conductive layer 16 is thus separated away from the stationary electrodes 12 with a result of ceasing the transmission of the high-frequency signal.

In the instant preferred embodiment of the switching device, the movable electrode 14 has the sponge member 15 which is provided on both upper and lower surfaces thereof with the non-porous layers 20 which are developed during hot-working of the material 17 by means of the rolls 18 or press molds 19. These non-porous layers 20 serve to prevent otherwise possible permeation, into the sponge member 15, of the adhesive agent 21 which are used to bond the resilient conductive layer 16 to one of the non-porous layers and to secure the movable electrode 14 to the flange portion 23a of the support member 23 with the other non-porous layer 20 bonded to the lower surface of the portion 23a. This in turn protects the sponge member 15 from losing its spongy or elastic property due to such permeation of the adhesive agent, and assures sure and snug contact of the resilient conductive layer 16 with the insulating film 13 and the stationary electrodes 12 thereby allowing stable and reliable switching actions. It is also apparent from the foregoing description that the presence of the non-porous layers 20 results in elimination of polyester or similar films covering the sponge member 17, as practiced in the prior art, to protect it against the above discussed penetration or permeation of the adhesive agent. Therefore, the process to manufacture the movable electrode and the entire switching assembly is significantly simplified.

Figure 4:
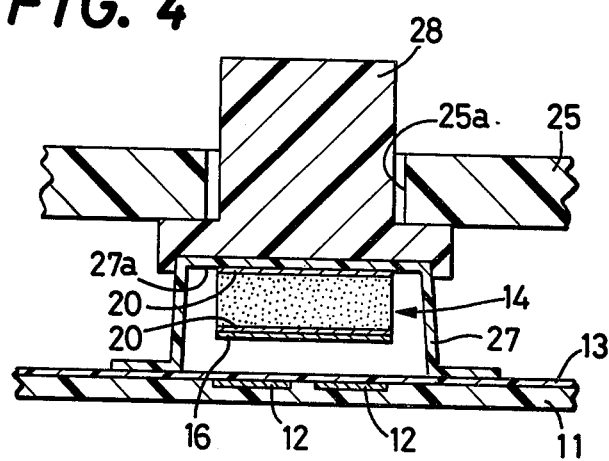
FIG. 4 is a side elevation, similar to FIG. 2, of another embodiment of the switching device.

Referring next to FIG. 4, another embodiment of the capacitive switching device is described below. For convenience, the same reference numberals will be used in FIG. 4 to identify the parts which are the same as in the preceding figures.

In this embodiment, the movable electrode 14 is bonded with the adhesive agent 21 to an inner surface 27a of a top wall of a hat-shaped rubber housing 27 of thin wall construction which is secured to the baseplate 11 so that the resilient conductive layer 16 faces the stationary electrodes 12. The rubber housing 27 serves as a resilient member in place of the coil spring 26 used in the preceding embodiment, i.e., biases a support member 28 (keystem 28) toward its upper position as shown in FIG. 4. More specifically stated, the top wall of the rubber housing 27 is held in abutting engagement with a lower surface of a lower flange portion of the support member 28 while urging the flange portion against the lower surface of the keyboard 25. Thus, the movable electrode 14 is normally kept away from the stationary electrodes 12.

The switching device of this alternative embodiment shown in FIG. 4 is substantially the same as the device of FIGS. 1 and 2. The only difference lies in the use of the rubber housing 27 in place of the coil spring 26, and the consequent change in the location at which the movable electrode 14 is disposed. Obviously, this embodiment is advantageous in that the rubber housing 27 protects the movable electrode 14 and the insulating film 13 from dirt, dust or other foreign matters which otherwise may stick to their surfaces.

While the described embodiments represent the preferred forms of the present invention, it is to be understood that modifications will occur to those skilled in the art without departing from the scope of the appended claims.

What is claimed is:

1. A capacitive switching device having a substrate baseplate, a pair of conductive-pattern stationary electrodes of planar configuration disposed on the substrate baseplate, a movable electrode disposed movably relative to the stationary electrodes so as to form a variable capacitor, an insulating film interposed between the stationary electrodes and the movable electrode, and actuating means for displacing the movable electrode toward and away from the stationary electrodes, the actuating means inlcuding a support member which carries the movable electrode and a manually operated portion, and further including a resilient member biasing the support member in a direction away from the stationary electrodes, said movable electrode comprising:

a sponge member consisting of a spongy porous layer, and substantially non-porous layers integral with and sandwiching said spongy porous layer, said non-porous layer having smooth surfaces; and a resilient conductive layer secured with an adhesive to one of said non-porous layers, the other non-porous layer being secured with an adhesive to said actuating means such that said resilient conductive layer faces said stationary electrodes through said insulating film.

2. A switching device as recited in claim 1, wherein said sponge member is formed by rolling a spongy porous material at elevated temperature.

3. A switching device as recited in claim 1, wherein said sponge member is formed by pressing a spongy porous material in dies at elevated temperature.

4. A switching device as recited in claim 1, wherein said resilient member comprises a coil spring and said movable electrode is secured directly to said support member.

5. A switching device as recited in claim 1, wherein said resilient member comprises an elastic housing secured to said baseplate, said movable electrode being secured to an inner surface of, and enclosed by, said elastic housing such that the movable electrode is movable by said support member.

6. A movable electrode for a capacitive switching device having a substrate base plate, and a pair of conductive-pattern stationary electrodes of planar configuration disposed on the substrate baseplate, said movable electrode being movable relative to the stationary electrodes so as to form a variable capacitor and comprising:

a sponge member consisting of a spongy porous layer, and substantially non-porous layers integral with and sandwiching said spongy porous layer, said non-porous layers having smooth surfaces; and a resilient conductive layer secured with an adhesive to one of said non-porous layers, the other non-porous layer being secured with an adhesive to said actuating means such that said resilient conductive layer faces said stationary electrodes.

7. A process of manufacturing a capacitive switching device which has a pair of conductive-pattern stationary electrodes of planar configuration disposed on a substrate baseplate and covered with an insulating film, a movable electrode disposed movably relative to the stationary electrodes so as to form a variable capacitor, and actuating means for displacing the movable electrode toward and away from the stationary electrodes and biasing the movable electrode in a direction away from the stationary electrodes, said process comprising the steps of:

compressing a sheet-like spongy porous material while applying heat to opposite sides thereof, and thereby producing a sponge member of a predetermined thickness having on said opposite sides upper and lower non-porous layers, respectively, which non-porous layers have smooth surfaces;

applying a coating of an adhesive agent to one surface of a sheet of release paper made of a material which does not permit said adhesive agent to permeate thereinto;

securing said sheet of release paper with said adhesive agent to said upper and lower non-porous layers of the sponge member;

removing said sheet of release paper from one of said upper and lower non-porous layers, and securing a resilient conductive layer to said one non-porous layer with said adhesive agent left thereon; and removing said sheet of release paper from the other of said upper and lower non-porous layers, and securing said sponge member to said actuating means with said adhesive agent left on said other non-porous layer such that said resilient conductive layer faces said stationary electrodes.

8. A process as recited in claim 7, wherein said sponge member is formed by rolling said sheet-like spongy porous material at elevated temperature.

9. A process as recited in claim 7, wherein said sponge member is formed by pressing in dies at elevated temperature.

10. A process as recited in claim 7, which further comprising a step of blanking said sponge member after said resilient conductive layer has been secured to said one of the upper and lower non-porous layers, to obtain a plurality of the sponge members each secured to said actuating means.

11. A capacitive switching device comprising:

a substrate baseplate;

a pair of conductive-pattern stationary electrodes of planar configuration disposed on said substrate baseplate;

a movable electrode disposed movably relative to said stationary electrodes so as to form a variable capacitor;

an insulating film interposed between said stationary electrodes and said movable electrode; and actuating means for displacing said movable electrode toward and away from said stationary electrodes, said actuating means including a support member which carries said movable electrode and a manually operated portion, and further including an elastic housing secured to said baseplate, said elastic housing enclosing said movable electrode and biasing said support member in a direction away from said stationary electrodes such that said movable electrode is movable by said support member, said movable electrode including a sponge member consisting of a spongy porous layer, and substantially non-porous layers integral with and sandwiching said spongy porous layer, said non-porous layer having smooth surfaces, said movable electrode further including a resilient conductive layer secured with an adhesive to one of said non-porous layers, the other non-porous layer being secured with an adhesive to an inner surface of said elastic housing such that said resilient conductive layer faces said stationary electrodes through said insulating film.

* * * * *